May 19, 1959 S. K. TALLY 2,887,558

ELECTRICAL RESISTORS AND PROCESS FOR MANUFACTURING SAME

Filed April 10, 1956

Sidney K. Tally
*INVENTOR.*

United States Patent Office 2,887,558

Patented May 19, 1959

2,887,558

ELECTRICAL RESISTORS AND PROCESS FOR MANUFACTURING SAME

Sidney K. Tally, Nashua, N.H., assignor, by mesne assignments, to Sanders Associates, Inc., Nashua, N.H., a corporation of Delaware Application April 10, 1956, Serial No. 577,352

7 Claims. (Cl. 201—73)

Figure 1:
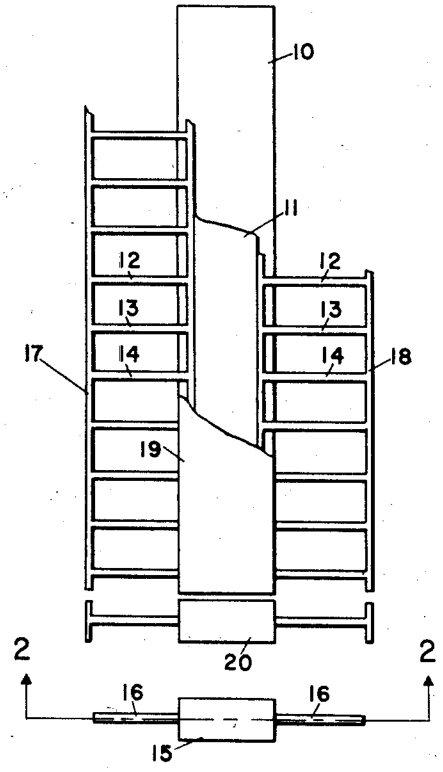

The present invention is directed to electrical resistors and particularly to resistors suitable for use with printed circuits. The invention is also directed to the process for manufacturing these resistors.

The advent of printed wiring on baseboards with the possibility of concentration of an extremely large number of conductors in a small area or volume has accentuated the need for reducing the size of electrical elements such as resistors. The bulky, cylindrical type of carbon or wire wound resistance conventionally employed occupies too much volume to be practical for usage in many printed circuit applications. Not only are the conventional resistors too large for simple printed circuit applications, but they are even less attractive for use in the module techniques now being widely adopted. In modules, wafers having printed wiring and circuit elements thereon are stacked, usually in groups of six, to provide all of the electrical wiring and circuit elements for a stage of an electronic unit, for example, for a video amplifier stage. The spacing between adjacent wafers in the stacked pile is such that conventional resistors can not be conveniently employed. There is need for thin, small resistors which can lie flat and be neatly affixed to the surface of a wafer. The present invention is directed to providing a resistor which satisfies these needs of printed circuit baseboards and modules. The resistor described herein has been referred to as a tape resistor in view of its method of manufacture and this term will be used.

It is therefore an object of the present invention to provide a new and improved electrical resistor which has none of the deficiencies and limitations of prior resistors.

It is a further object of the present invention to provide a new and improved electrical resistor which is extremely small and thin.

It is a still further object of the present invention to provide a new and improved electrical resistor which is relatively easy to manufacture.

It is also an object of the present invention to provide the method of manufacture of a new and improved electrical resistor.

In accordance with the present invention, there is provided an electrical resistor comprising a first layer of material coated with a resistive substance and a second layer of material coated with a resistive substance. A pair of substantially T-shaped conductive leads are laminated firmly between the first and second layers in a predetermined spaced relation.

Also in accordance with the present invention there is provided a process of manufacturing an electrical resistor. The process comprises providing a first elongated strip of material coated with a resistive substance. A multiplicity of conductive leads are placed on the surface of the strip perpendicular to the strip and along both longitudinal edges thereof. The conductive leads are fixed to and maintained in parallel spaced relation by a pair of conductive elements perpendicular to the conductive leads; thus, forming a ladder-like structure. Laminated to the first strip of material and a part of each of the conductive leads is another elongated strip of material coated with a resistive substance. The strips are then cut parallel to and between the spaced leads to disconnect adjacent conductive leads and provide a plurality of resistors.

For a better understanding of the present invention, together with other and further objects thereof, reference is made to the following description taken in connection with the accompanying drawing and its scope will be pointed out in the appended claims.

Figure 2:
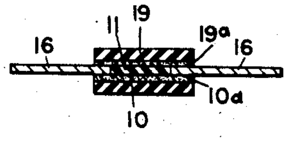

In the drawings:

Fig. 1 represents, in partially cut-away plan view, an electrical resistor in accordance with the present invention at different stages of manufacture; and Fig. 2 represents a cross sectional view of one of the resistors of Fig. 1.

Figs. 1 and 2 represent an electrical resistor having a first layer 10 of flexible impregnable material coated with a resistive substance 10*a*. The material 10 may comprise, for example, Silicone Impregnated Quinterra Asbestos as manufactured by Johns-Manville. The strip 10 is as wide and as long as can easily be handled. Preferably the width is 5⁄16" and the length is six or eight inches. The resistive substance 10*a* used to impregnate or coat the material is, for example, channel and furnace carbon mixed with silicone resin varnish and an inert filter such as silica. As explained more fully hereinafter the proportion by volume of the varnish, silica and carbon determines the magnitude of the resistance to be obtained.

The resistor also may include an intermediate layer 11 of narrower material substantially centered on the layer 10. The material 11 is the same in composition as the material 10 except that it is not coated with the silicone varnish carbon mixture. It is, however, impregnated with silicone. In one form of resistor the strip 11 is approximately ¼" wide. The principal purpose of the strip 11 is to provide a thickness of material substantially equal to that of the conductors to prevent cracking and breakage of the two outer strips 10 and 19 during the pressure curing process, to be described hereinafter. It also provides a spacer or separator for the conductive leads such as 12, 13 and 14 and prevents cracks from occurring around the points of contact of these leads and the outer strips 10 and 19.

The resistor represented in Fig. 1 also comprises a pair of conductive leads attached to opposite edges of the material 10 and, if the strip 11 is used, separated from each other by the narrower material 11. As represented in Fig. 1, there are many pairs of conductive leads such as the pairs 12, 13 and 14. The separated resistor 15 at the bottom of Fig. 1 and represented in cross section in Fig. 2 has the pair of leads 16. The conductive leads initially are the rung sections of a ladder-like set of stampings 17 and 18. The stampings 17 and 18 are obtained from, for example, copper sheet having a thickness of .004". To eliminate the harmful effects of copper oxidation and to prevent chemical action between the Kel-F and copper, they are nickel plated.

Finally, the electrical resistor comprises a top layer 19 also of flexible material coated with a resistive substance 19*a*. The top layer 19 is in all respects a duplicate of the lower layer 10.

*Method of manufacturing the electrical resistor*

The resistor represented in the drawing is manufactured by placing the elongated strip 10 on the flat surface of a form. The ladder-like members 17 and 18 are then positioned with respect to the tape 10 so that the inner rails of these ladders extend slightly over the edges of the tape 10 in the manner represented in the drawing. These inner rails are aligned to be parallel to the edges of the tape 10 and are spaced a constant distance from one another by pins on the alignment jig. If the strip 11 is used, it is inserted between the inner rails to maintain this spacing. The second or top impregnated strip 19 is then positioned in perfectly superposed position over the material 10 to sandwich the inner rails of the ladder-like members 17 and 18 and the narrower strip 11, if used, between the strips 10 and 19.

A pressure of approximately 80 p.s.i. is then applied to this assembly and while under such pressure it is slowly moved through an oven to cure the coatings on the tape materials. This curing under pressure not only induces adherence of the coated strips and conductors, but also seems to bring about stableness of resistance quickly. The assembly is started through the oven at room temperature and gradually raised to a temperature of approximately 320° C. The curing time is approximately 80 minutes and the assembly is maintained at the 320° C. temperature for approximately 12 minutes. After removal from the oven the cured material is cooled at room temperature in ambient humidity for approximately 90 minutes. After this cooling the assembly is cyclically heated for approximately 10 cycles from a lower temperature of approximately 25° C. to an upper temperature of approximately 250° C. The cycles are, for example, of 6-minute duration with approximately 3 minutes between each cycle.

After the last curing cycle the resistor assembly is removed from the portable press jig and cut into separate resistors, as represented by resistor 15 or resistor 20, by a transverse cut made across the assembled tapes between the rungs of the ladder structures. The individual resistors are then tested to assure that they fall within the resistor tolerances. If resistor adjustment is needed the tape material may be trimmed or otherwise diminished in area to provide a resistance of desired magnitude. If desired, the individual resistors may then be encapsulated to seal them from ambient humidity. Preferably, the encapsulation material is a plastic such as monochlorotrifluroethylene. One form of this plastic is conventionally known as Kel-F and is manufactured by the M. W. Kellogg Company. Another form is known as fluorothene and is manufactured by Bakelite Corporation.

As previously mentioned, the tapes 10 and 19 are coated with a resistive substance 10*a* and 19*a*, respectively, preferably a mixture of silicone resin varnish, silica filler, and channel and furnace carbon. The relative proportions of these ingredients in the mixture determine the resistance obtainable. A range of 3½ to 19 parts of silicone varnish to one part of channel and furnace carbon with appropriate amounts of silica filler provides a resistance range of 100 to approximately 7 megohms. The resistance mixture having the desired characteristics of resistance and humidity variations with changes in temperature has 3½ parts of varnish, 1 part of carbon and no silica. As more varnish is added to change the resistance to be obtained, silica is added in the ratio of approximately equal parts of silica and varnish. For example, 15 parts of silicone varnish, 15 parts of silica and 1 part of carbon provides a resistance of approximately 50 kilohms. In order to provide consistency of resistance, humidity and other characteristics, the mixture of the carbon silicone varnish and filler must be extremely homogeneous. The desired degree of homogeneity is provided by many rigidly controlled stages of ball milling, the number of stages being determined by periodic examination of the mix.

From the above it should be apparent that extremely small, thin resistors highly useful in printed circuits and module manufacture are provided by the method described. Resistors manufactured in this manner have a wattage rating of ¼ watt at 125° C., are approximately ⅜" long exclusive of their leads, ⅛" wide and .01" thick.

While there has been described what is at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. An electrical resistor, comprising: a first layer of material coated with a resistive substance; a second layer of material coated with a resistive substance; and a pair of substantially T-shaped conductive leads in a predetermined spaced relation laminated firmly between said first and second layers.

2. An electrical resistor, comprising: a first layer of flexible material coated with a resistive substance; a second layer of flexible material coated with a resistive substance; an intermediate layer of non-conductive, narrower, flexible material substantially centered on said first mentioned layer of material; and a pair of substantially T-shaped conductive leads laminated firmly between said first and second layers and maintained in a predetermined spaced relation by means of said intermediate layer of material.

3. An electrical resistor, comprising: a first layer of flexible material coated with a resistive substance; a second layer of flexible material coated with a resistive substance; an intermediate layer of narrower, non-conductive material centered between said first and second layers; and a pair of substantially T-shaped conductive leads laminated firmly between said first and second layers, the top edges of said T-shaped leads being maintained in parallel spaced relation by means of said intermediate non-conductive layer.

4. An electrical resistor, comprising: a first layer of material coated with a resistive substance; a second layer of material coated with a resistive substance; an intermediate layer of narrower, non-conductive material substantially centered between said first and second layers; a pair of thin, flat, substantially T-shaped conductive leads laminated firmly between said first and second layers, the top edges of said T-shaped leads being maintained in parallel spaced relation by means of said intermediate non-conductive layer.

5. The process of manufacturing an electrical resistor, which comprises: providing a first, elongated strip of material coated with a resistive substance; placing a multiplicity of conductive leads on the surface of said strip, perpendicular to said strip and along both longitudinal edges thereof, said conductive leads being fixed to and maintained in parallel spaced relation by a pair of conductive elements perpendicular to said conductive leads, thus forming a ladder-like structure; laminating to said first strip of material and a part of each of said conductive leads another elongated strip of material coated with a resistive substance; and cutting through said strips parallel to and between said spaced leads to disconnect adjacent conductive leads and provide a plurality of resistors.

6. The process of manufacturing an electrical resistor, which comprises: providing a first elongated strip of material coated with a resistive substance; placing a multiplicity of conductive leads on the surface of said strip perpendicular to said strip along one longitudinal edge thereof, said conductive leads being fixed to and maintained in parallel spaced relation by means of a pair of parallel conductive elements perpendicular to said conductive leads, thus forming a ladder-like structure; placing a multiplicity of conductive leads, fixed in parallel spaced relation by means of parallel conductive elements, on the surface of said strip perpendicular to said strip along the other longitudinal edge thereof with said opposed conductive leads transversely aligned in one-to-one correspondence; centering an elongated narrower strip of non-conductive material on said first strip to separate uniformly said pairs of conductive leads; laminating to said narrow strip and part of each of said conductive leads a second elongated strip of material coated with a resistive substance; and cutting through said strips parallel to and between said leads to disconnect adjacent conductive leads and provide a plurality of resistors.

7. The process of manufacturing an electrical resistor, which comprises: coating a fibrous material with a mixture of a silicone resin and carbon; selecting a first elongated strip of said material; preparing a plurality of ladder-like members from a thin, flat sheet of conductive material; placing a pair of said ladder-like members on the surface of said strip at opposite longitudinal edges thereof with the rungs of said members aligned in one-to-one correspondence; centering an elongated narrower strip of a non-conductive material on said first strip to separate said pair of ladder-like members uniformly throughout their length; laminating to said narrow strip and part of each of said pair of ladder-like members another elongated strip of said material congruent to said first elongated strip; applying heat and pressure to the assembly of said strips and conductive members to cure said assembly; cooling said assembly; and cutting through said assembly between and parallel to the rungs of said ladder members to provide individual resistors.

References Cited in the file of this patent

UNITED STATES PATENTS

| | | |
|---|---|---|
| 2,061,516 | Frese | Nov. 17, 1936 |
| 2,176,604 | Benkelman | Oct. 17, 1939 |
| 2,629,166 | Marsten et al. | Feb. 24, 1953 |
| 2,683,673 | Silversher | July 13, 1954 |
| 2,717,946 | Peck | Sept. 13, 1955 |
| 2,745,931 | Heibel | May 15, 1956 |
| 2,751,477 | Fitzgerald | June 19, 1956 |